(12) United States Patent
Montreuil

(10) Patent No.: US 7,714,588 B2
(45) Date of Patent: *May 11, 2010

(54) CURRENT SENSOR WITH A MAGNETIC STRUCTURE FOR MEASURING AN ELECTRICAL CURRENT ON AN ELECTRICAL CONDUCTOR

(75) Inventor: Michel Montreuil, Saint-Charles-de-Bellechasse (CA)

(73) Assignee: Corporation Nuvolt Inc., Levis, Quebec (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/254,056

(22) Filed: Oct. 20, 2008

(65) Prior Publication Data

US 2009/0039868 A1 Feb. 12, 2009

Related U.S. Application Data

(62) Division of application No. 11/430,958, filed on May 10, 2006, now Pat. No. 7,477,058.

(60) Provisional application No. 60/679,997, filed on May 12, 2005.

(51) Int. Cl.
*G01R 31/08* (2006.01)
*G01R 15/18* (2006.01)
*G01R 15/20* (2006.01)

(52) U.S. Cl. ............... 324/522; 324/117 R; 324/117 H
(58) Field of Classification Search ............. 324/117 H
See application file for complete search history.

(56) References Cited

U.S. PATENT DOCUMENTS 6,373,241 B1 * 4/2002 Weber et al. ............. 324/207.2
7,411,326 B2 * 8/2008 Achor et al. ............. 310/68 B
7,477,058 B2 * 1/2009 Montreuil ................. 324/522

* cited by examiner

*Primary Examiner*—Jeff Natalini
(74) *Attorney, Agent, or Firm*—Ogilvy Renault, LLP; Isabelle Chabot

(57) ABSTRACT

There is provided a current sensor for monitoring electrical disturbances on an electrical circuit having an electrical conductor. The current sensor comprises a magnetic flux sensor for sensing a magnetic flux generated by a current flowing in the electrical conductor and for providing a signal representative of the current; and a processor for acquiring the signal from the magnetic flux sensor, for detecting an electrical disturbance on the current and for providing electrical disturbance data. The current sensor may also comprise a ring-shaped magnetic structure for receiving the electrical conductor and an opening within the ring-shaped magnetic structure for receiving the magnetic flux sensor. The magnetic flux sensor being for sensing a magnetic flux generated in the magnetic structure by the current in the electrical conductor.

28 Claims, 13 Drawing Sheets

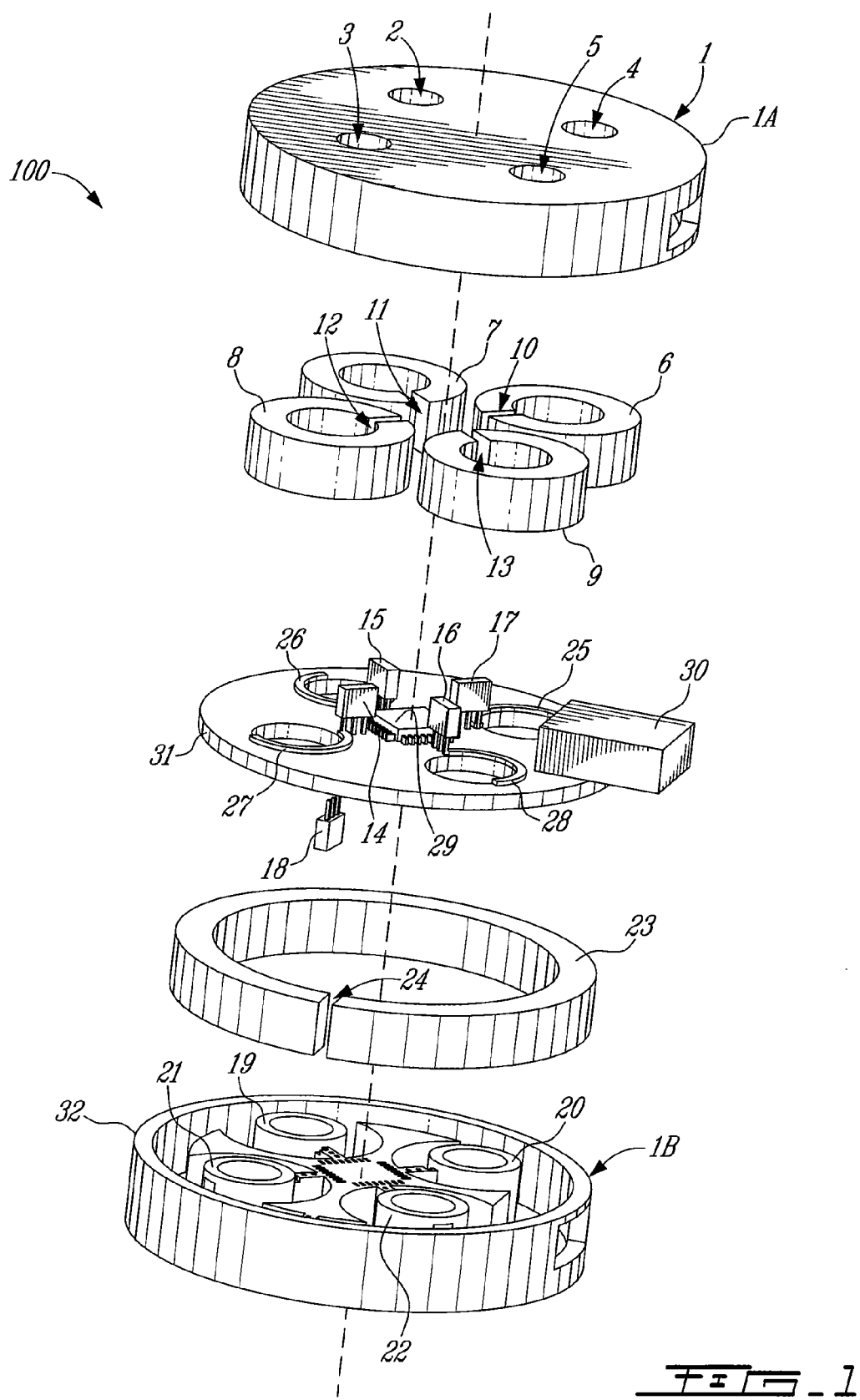

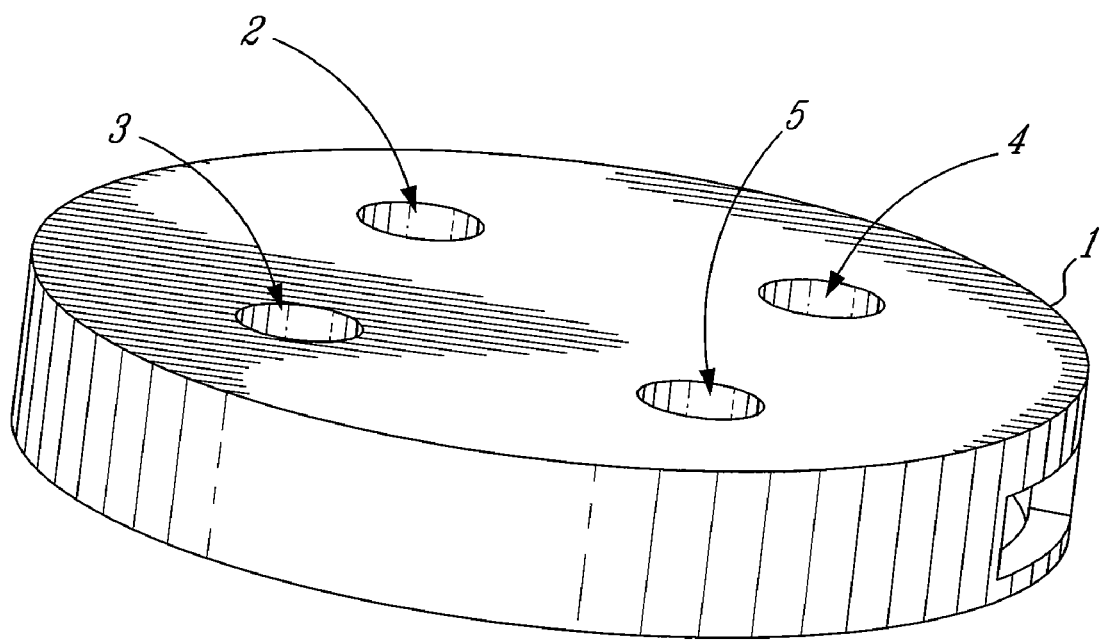
FIG_1A
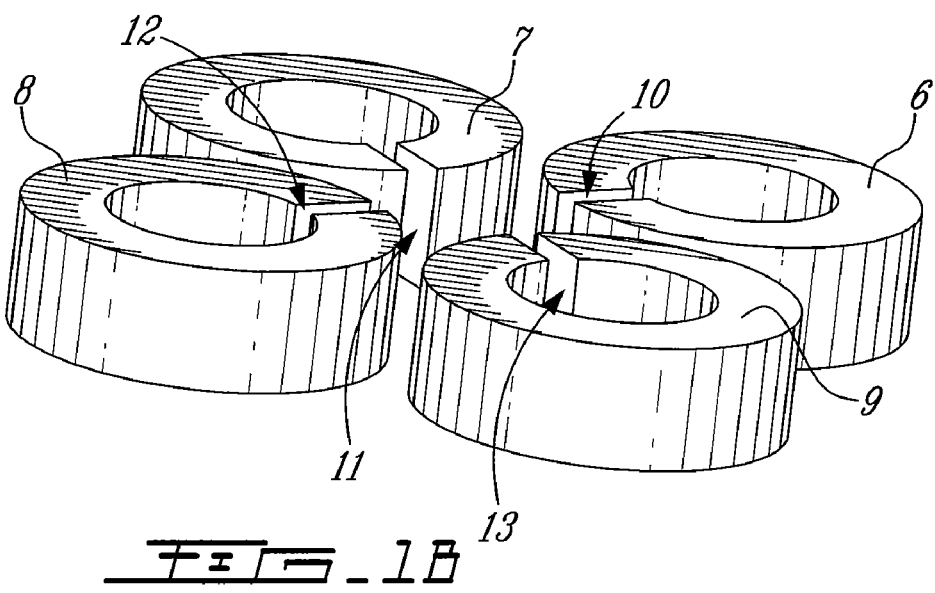
FIG_1B

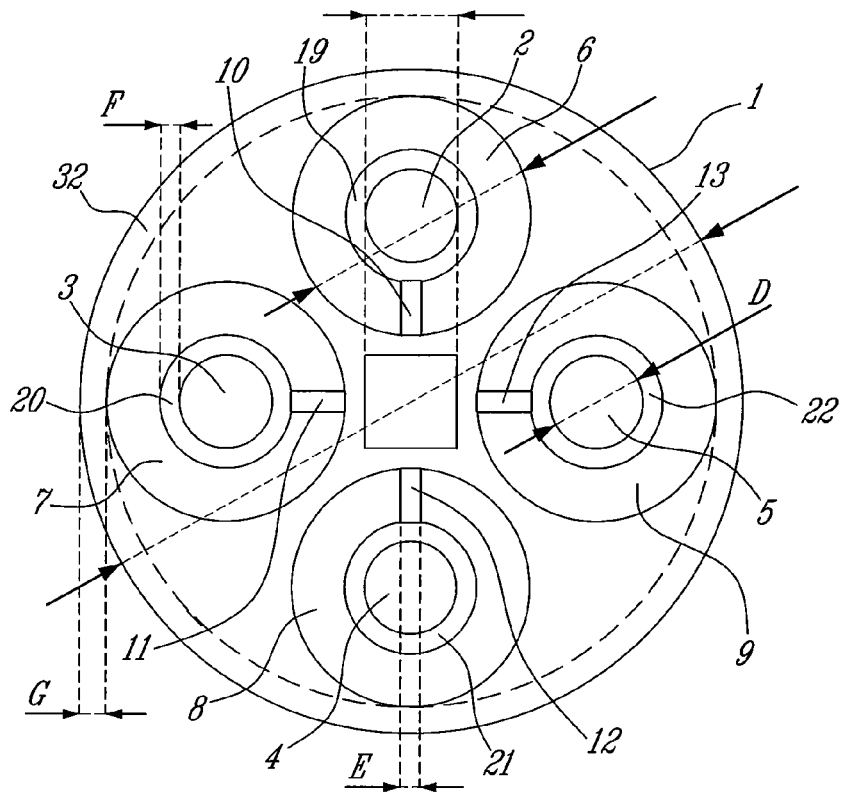
FIG_2A
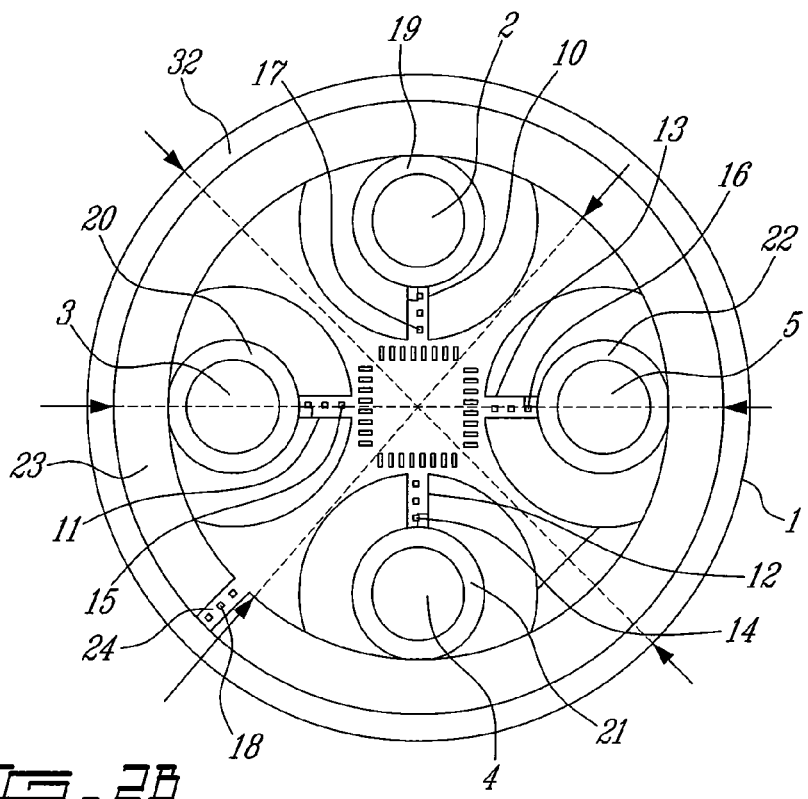
FIG_2B

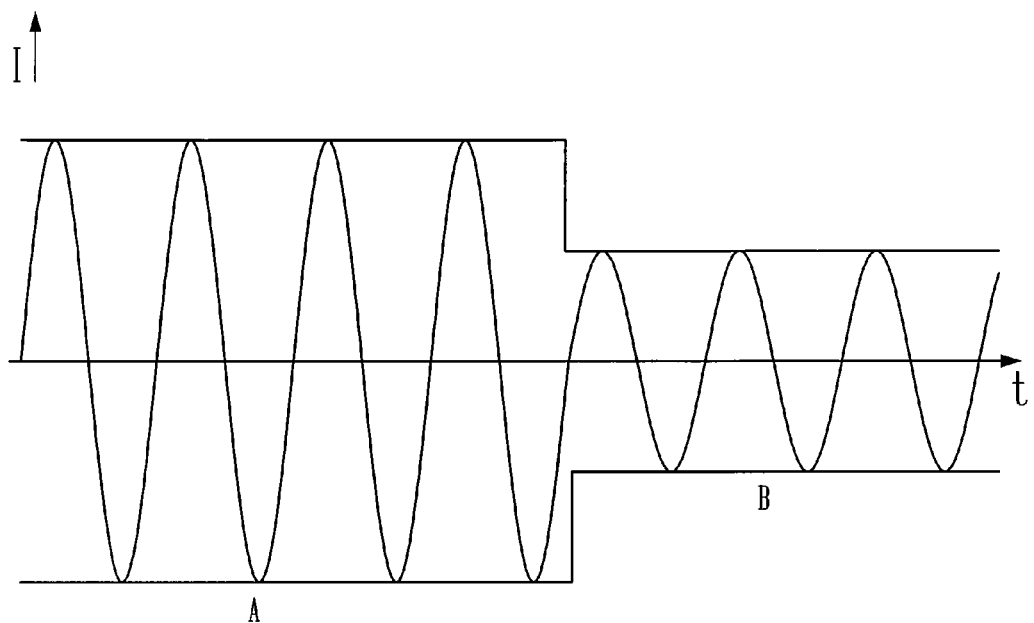
FIG_3
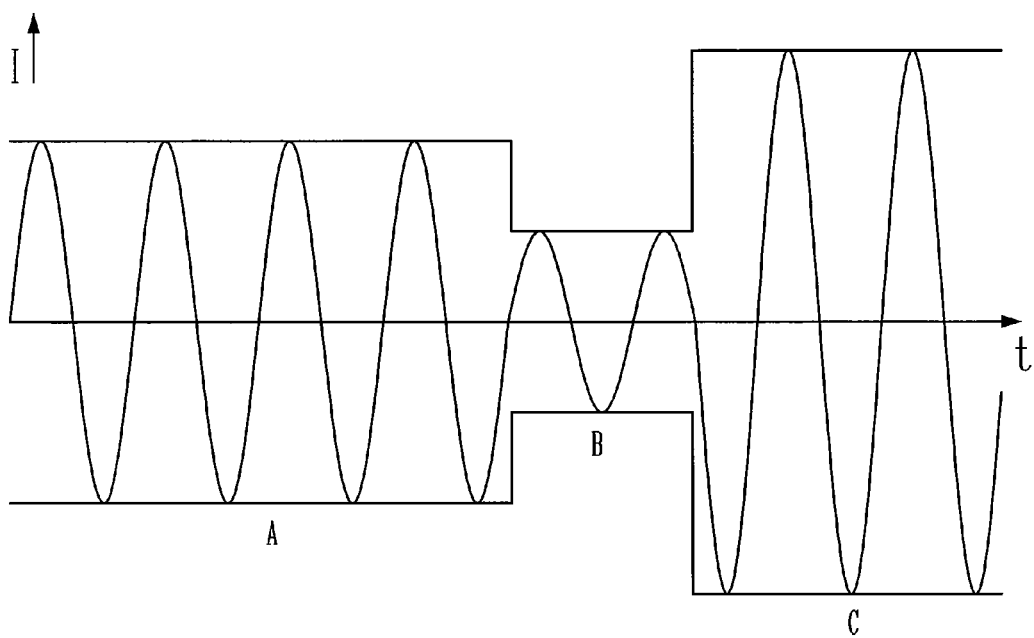
FIG_4

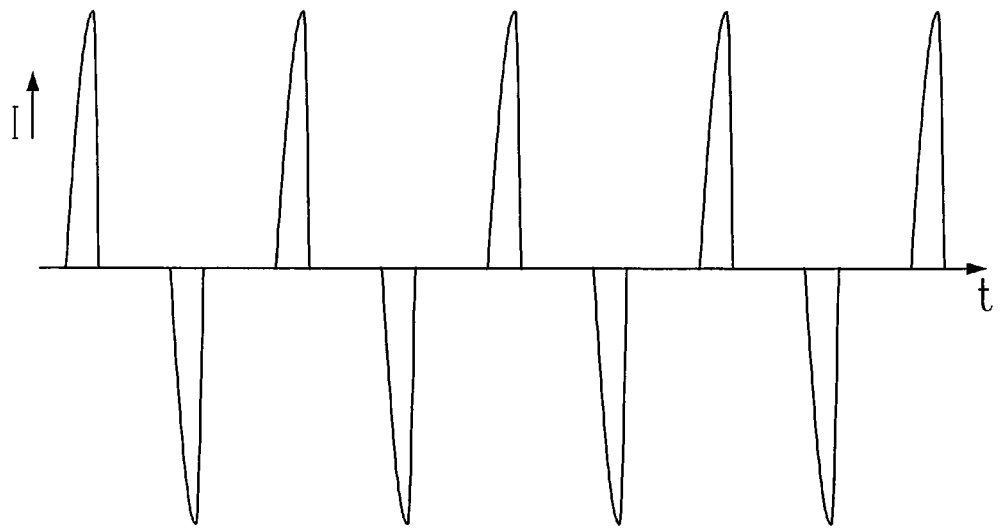
FIG_7A
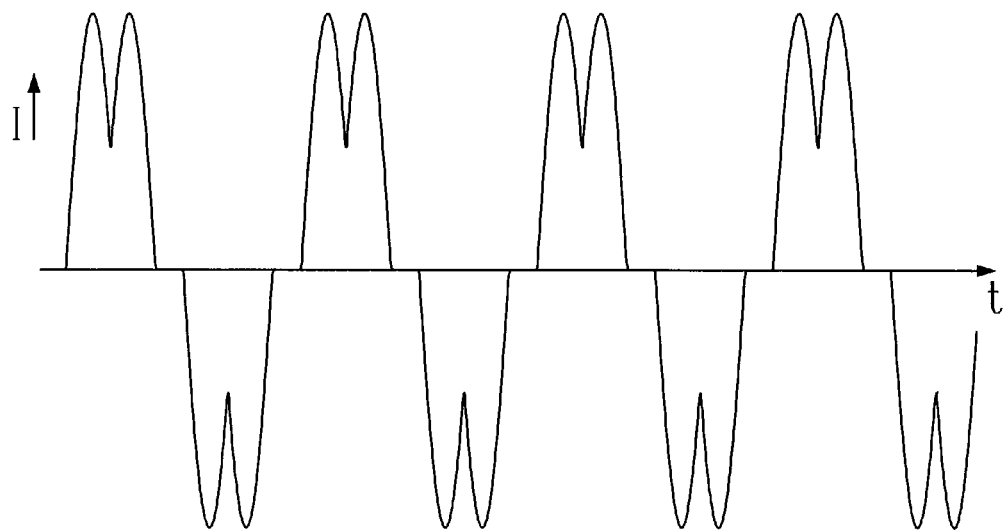
FIG_7B

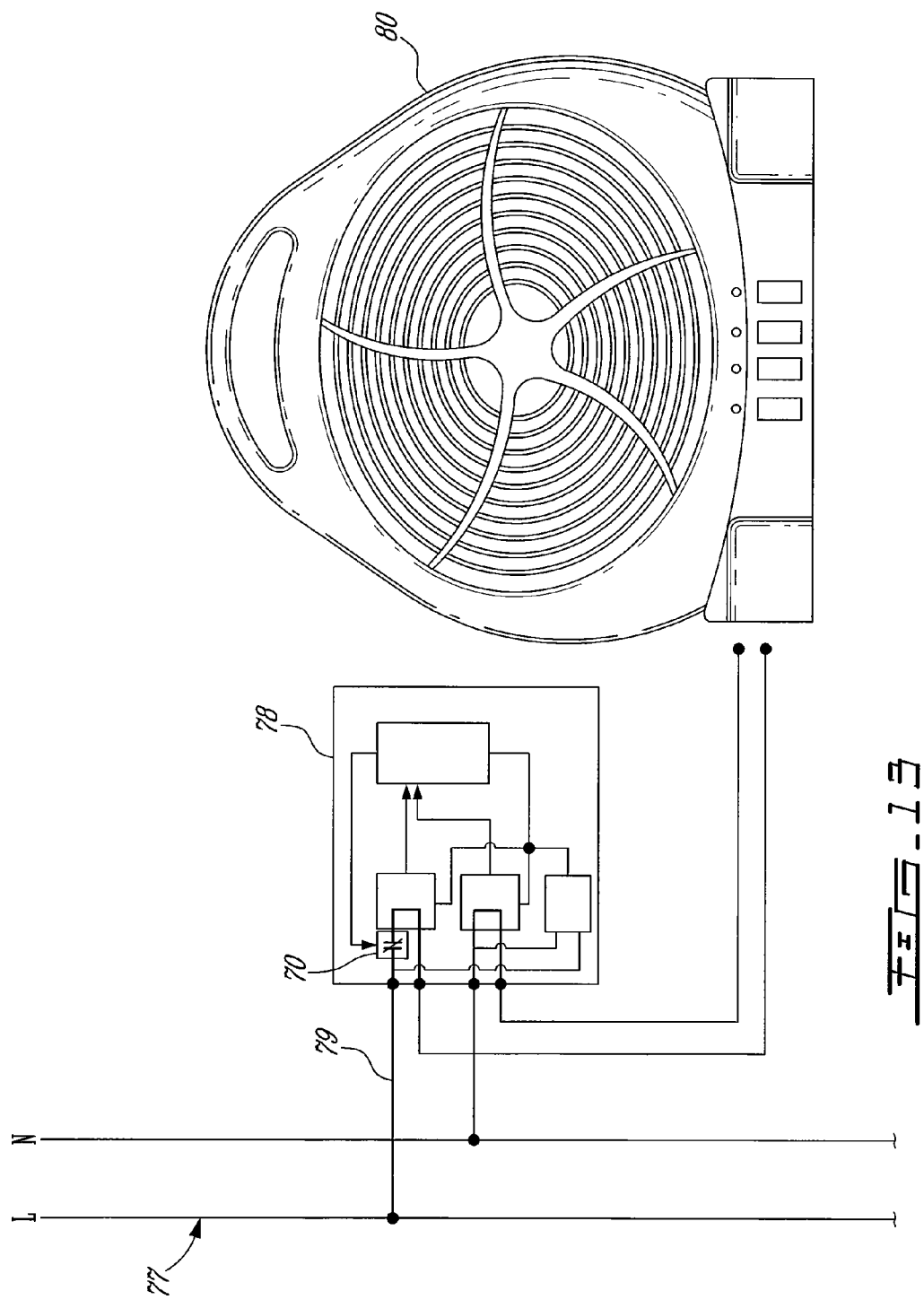

CURRENT SENSOR WITH A MAGNETIC STRUCTURE FOR MEASURING AN ELECTRICAL CURRENT ON AN ELECTRICAL CONDUCTOR

CROSS-REFERENCE TO RELATED APPLICATIONS

This application is a divisional of U.S. patent application Ser. No. 11/430,958 filed May 10, 2006, now U.S. Pat. No. 7,477,058 and which claims priority under 35US§119(e) of U.S. provisional patent application 60/679,997 filed May 12, 2005; the specifications of which are hereby incorporated by reference.

TECHNICAL FIELD

This application is related to the field of current sensors.

BACKGROUND OF THE ART

Stray currents, especially 60 Hz currents, flowing on the grounding network of agricultural facilities may create zones of discomfort for the animals and cause physiological reactions of the animals resulting into abnormal health conditions.

The new technologies used to control electric motors which modify the level and the frequency of the current and the presence of electrical arcs on the distribution network of a farm are also among the factors that have direct consequences on the quality of the animal environment (see U.S. Pat. No. 6,690,565 B2).

Two types of variable speed motor controllers are frequently used in agricultural facilities. One is based on thyristors switched at a rate of 120 times per second while the other is composed of Insulated Gate Bipolar Transistor switched between 10000 and 20000 times per second.

The insulation of electric motor windings and also the insulation of the electric cables feeding the motors have capacitive reactance components in regard to the ground. These capacitive reactance components are responsible for current leaks when exposed to high frequency currents. The transmission modes of the leakage current are the same for the two technologies of motor controllers but the leakage will be more important in the case of the technology operating at higher frequencies.

The electrical arcs, in addition to being responsible of many fires, have important consequences on the animal environment because they produce harmonics of various levels and frequencies on the grounding network. Since electrical arcs may arise in every component of electrical networks, it is thus useful to monitor each component in order to perform early detection, characterize and predict any possible fault.

SUMMARY

According to one aspect, there is provided a current sensor for measuring an electrical current on an electrical circuit having an electrical conductor, said current sensor comprising: a ring-shaped magnetic structure for receiving said electrical conductor whereby the magnetic structure can be positioned along said electrical conductor, wherein an interior diameter of said ring-shaped magnetic structure is substantially equal to a diameter of said electrical conductor; a magnetic flux sensor for sensing a magnetic flux generated in said magnetic structure by a current flowing in said electrical conductor and for providing a signal representative of said current; said ring-shaped magnetic structure comprising an opening for receiving said magnetic flux sensor; an analog to digital converter for acquiring said signal from said magnetic flux sensor and converting said signal into a digital sensor data; a processor for receiving said digital sensor data, detecting an electrical disturbance on said current and providing electrical disturbance data; and a printed circuit, said magnetic flux sensor, said analog to digital converter and said processor being mounted thereon.

According to another aspect, there is provided a current sensor for measuring an electrical current in an electrical circuit having an electrical conductor, said current sensor comprising: a magnetic structure for receiving said electrical conductor whereby the magnetic structure can be positioned along said electrical conductor; a magnetic flux sensor in series with said electrical conductor for sensing a magnetic flux generated in said magnetic structure by a current flowing in said electrical conductor and providing a signal representative of a value of said current at a specific time over a period of time; an analog to digital converter for acquiring said signal of said value of said current over said period of time from said magnetic flux sensor and converting said signal into digital sensor data; a processor for receiving said digital sensor data, detecting an electrical disturbance on said electrical conductor using said value of said current over said period of time and for providing an electrical disturbance signal; and a printed circuit, said magnetic flux sensor, said analog to digital converter and said processor being mounted thereon.

According to yet another aspect, there is provided an electrical current monitoring system, comprising: a plurality of current sensors each associated with an electrical conductor and an identifier, each having: a magnetic structure for receiving said electrical conductor whereby the magnetic structure can be positioned along said electrical conductor, a magnetic flux sensor in series with said electrical conductor for sensing a magnetic flux generated in said magnetic structure by a current flowing in said electrical conductor and providing a signal representative of a value of said current at a specific time over a period of time, an analog to digital converter for acquiring said signal of said value of said current over said period of time from said magnetic flux sensor and converting said signal into digital sensor data, a processor for receiving said digital sensor data, detecting an electrical disturbance on said electrical conductor using said value of said current over said period of time and for providing an electrical disturbance signal, and a printed circuit, said magnetic flux sensor, said analog to digital converter and said processor being mounted thereon; a networking module for combining data provided by said plurality of current sensors; and a processing module for receiving and for analyzing the combined data, for monitoring and for locating, using said identifier, said electrical disturbance and for alerting in case of abnormal situations.

According to still another aspect, there is provided a current sensor comprising a ring-shaped magnetic structure for receiving an electrical conductor whereby the magnetic structure can be positioned along the electrical conductor; a magnetic flux sensor for evaluating a magnetic flux generated by a current flowing in the electrical conductor; an opening within the ring-shaped magnetic structure for receiving the magnetic flux sensor; a data acquisition module for receiving a reading from the magnetic flux sensor concerning the current. In one embodiment, the current sensor comprises a plurality of ring-shaped magnetic structures, magnetic flux sensors and openings and wherein each of the plurality is for one of a plurality of electrical conductors.

Additionally, the current sensor can comprise a global ring-shaped magnetic structure surrounding all of the plurality of ring-shaped magnetic structure; and a global magnetic flux sensor for evaluating a magnetic flux generated by currents flowing in all the electrical conductors. A differential reading of current flowing in each conductor can then be measured.

The reliability of the measurements is independent of the location of the current sensor since its unique design makes it insensitive to surrounding electromagnetic fields. Also, the size of the orifices where the conductors are inserted is chosen according to the size of the conductors to insure a perfect fit and thus eliminate any positioning reading error.

The proximity between the Hall Effect sensors and the signal processor eliminates the error usually caused by the length and the impedance of the conductors between the reading instrument and the sensor.

There is provided a current sensor for monitoring electrical disturbances on an electrical circuit having an electrical conductor. The current sensor comprises a magnetic flux sensor for sensing a magnetic flux generated by a current flowing in the electrical conductor and for providing a signal representative of the current; and a processor for acquiring the signal from the magnetic flux sensor, for detecting an electrical disturbance on the current and for providing electrical disturbance data. The current sensor may also comprise a ring-shaped magnetic structure for receiving the electrical conductor and an opening within the ring-shaped magnetic structure for receiving the magnetic flux sensor. The magnetic flux sensor being for sensing a magnetic flux generated in the magnetic structure by the current in the electrical conductor.

BRIEF DESCRIPTION OF THE DRAWINGS

Further features and advantages of the present invention will become apparent from the following detailed description, taken in combination with the appended drawings, in which:

FIG. 1 is an exploded view of the current sensor in accordance with an embodiment of the invention;

FIG. 1A is a perspective view of the top portion of the casing of the current sensor of FIG. 1;

FIG. 1B is a perspective view of the individual magnetic structures for each conductor of the current sensor of FIG. 1;

FIG. 2A and FIG. 2B are plan views of the current sensor of FIG. 1;

FIG. 3 is a graph illustrating a line current;

FIG. 4 is a graph illustrating a current inrush;

FIG. 7A is a graph illustrating the current of a single phase PWM type motor controller;

FIG. 7B is a graph illustrating the current of a three-phase PWM type motor controller;

FIG. 13 is a block diagram showing a possible use of an intrusive current sensor according to an embodiment of the invention.

It will be noted that throughout the appended drawings, like features are identified by like reference numerals.

DETAILED DESCRIPTION

According to an embodiment, the present invention may perform high resolution current measurements and recordings of transient phenomena (amplitude, frequency).

According to an embodiment, the present invention may provide the user with a tool which generates an electrical signal. From the spectral analysis of the electrical signal, it will be possible to identify any electrical disturbance likely to affect the electrical equipment, prevent against animals health issues related to the presence of current in their environment and protect the assets by early detection of possible electrical causes of fire.

Figure 1C:
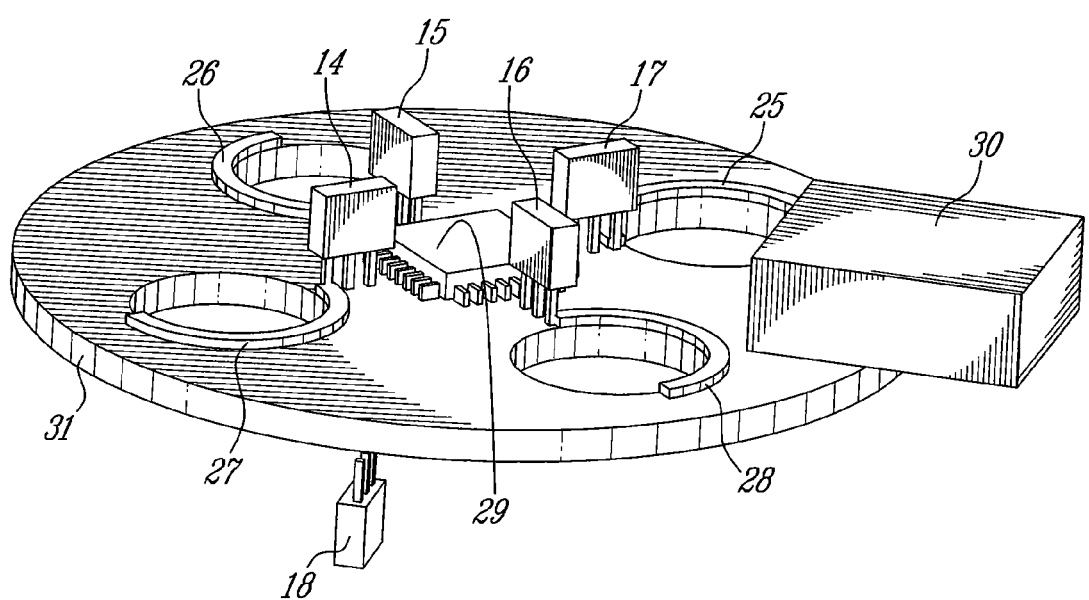
FIG. 1C is a perspective view of the printed circuit along with the magnetic flux sensors, the voltage detector and the processor of the current sensor of FIG. 1.
Figure 1D:
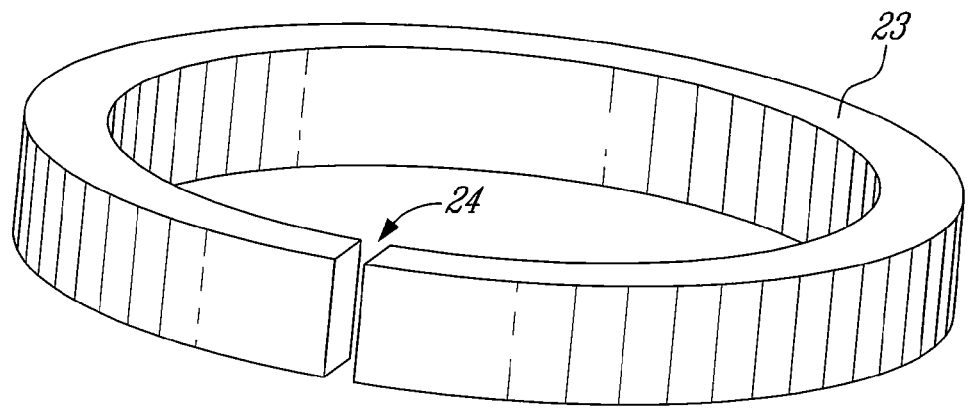
FIG. 1D is a perspective view of the global magnetic structure for all four conductors of the current sensor of FIG. 1.
Figure 1E:
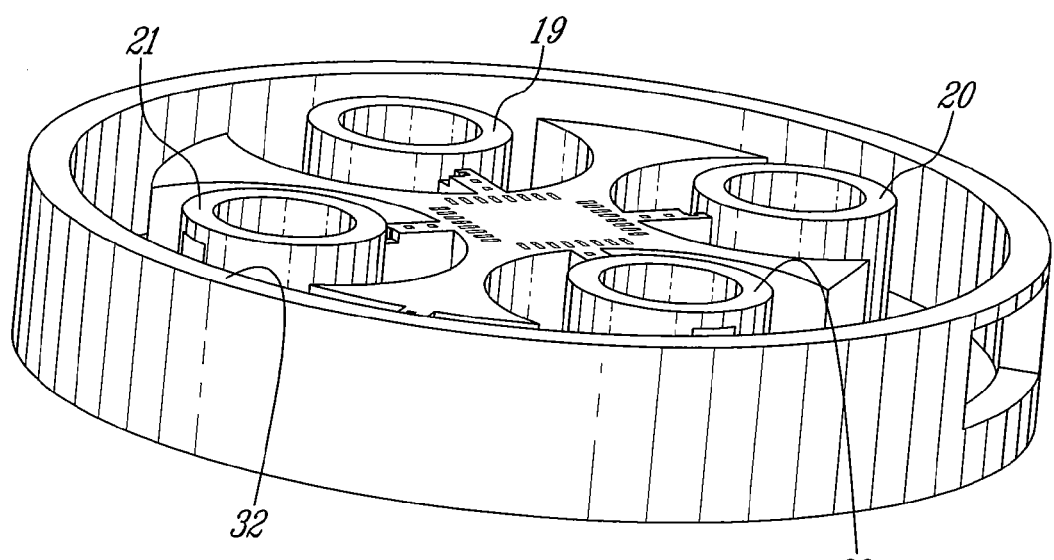
FIG. 1E is a perspective view of the bottom portion of the casing as well as the retaining shoulders for the components of the current sensor of FIG. 1.

The exploded view of an embodiment shown in FIG. 1 shows the arrangement of the printed circuit 31 and the components in accordance with an embodiment of the invention. FIGS. 1A to 1E are enlarged views of each portion of FIG. 1.

The current sensor of FIG. 1 captures signals and can convert the values into specific digital formats and also offers digital communication functionalities.

The current sensor components are all included in a casing 1. The current sensor 100 is designed to carry all the conductors (line and neutral) of a specific circuit. Each conductor (not shown) will pass through an individual input hole 2, 3, 4 and 5, allowing for an analysis of each conductor current characteristics. Inputs number 2, 3 and 4 are dedicated to the line conductors while input number 5 is for the neutral conductor. The diameter of these inputs is adapted to the conductor diameter which permits to avoid the influence of the surrounding electromagnetic fields generated by other current carrying conductors or equipment. It should be noted that it would be possible to create a current sensor adapted to receive any number of conductors, even a grounding conductor. In an embodiment, there will be three line conductors and one neutral conductor.

The casing 1 is composed of two sections. The bottom section 1B is moulded to receive and organize all the components of the current sensor. The top section 1A acts as a cover; it protects and holds the components in place.

Small ferrites and/or other magnetic material 6, 7, 8 and 9, sized according to the size of the electrical conductor are used. An opening 10, 11, 12 and 13 is practiced in the magnetic structure to receive magnetic flux sensors 14, 15, 16 and 17, Hall effect sensors for instance.

Each magnetic structure 6, 7, 8 and 9 is machined to obtain a precise opening 10, 11, 12 and 13. These openings 10, 11, 12 and 13 insure the consistency of the magnetic flux and guaranty the precision of the magnetic flux sensors 14, 15, 16 and 17.

Another aspect of the current sensor shown in FIG. 1 is the positioning of the magnetic structure 6, 7, 8 and 9 and its protection. Positioning and keeping in place a magnetic structure 6, 7, 8 and 9 is complex when the work is done manually with the use of glue. The retaining shoulders 19, 20, 21 and 22 maintain the magnetic structures 6, 7, 8 and 9 and magnetic flux sensors 14, 15, 16 and 17 simply and precisely.

The magnetic structures 6, 7, 8 and 9 are protected from the electrical conductors (not shown) by the retaining shoulders 19, 20, 21 and 22. These retaining shoulders are machined according to the magnetic structures 6, 7, 8 and 9 dimensions. The magnetic structures 6, 7, 8 and 9 are aligned with the magnetic flux sensors 14, 15, 16 and 17 and glued for protection.

A printed circuit 31 is used to position the magnetic flux sensors 14, 15, 16 and 17 into the openings 10, 11, 12 and 13 of the magnetic structures 6, 7, 8 and 9 before the whole is glued.

As mentioned earlier, the Hall Effect sensor, compared to regular current transformer, offers a greater frequency range. It makes possible the spectral analysis of low and medium frequencies.

According to an embodiment of the invention, another aspect of the current sensor consists of using small ferrites and/or other magnetic material 23, sized according to the current sensor diameter. An opening 24 is performed in the magnetic structure 23 to receive a magnetic flux sensor 18.

This magnetic structure 23, with the use of a magnetic flux sensor 18 will perform the reading of currents in differential mode when the line currents are important. All the line conductors 2, 3, 4 and 5 will pass through this magnetic structure 23.

In this embodiment, the magnetic structure 23 is machined to obtain a precise opening 24. This opening 24 ensures the consistency of the magnetic flux and guaranties the precision of the magnetic flux sensor 18.

Positioning and keeping in place a magnetic structure 23 is complex when the work is done manually with the use of glue. The retaining shoulder 32 maintains the magnetic structure 23 and magnetic flux sensor 18 simply and precisely. The magnetic structure 23 is protected from the electrical conductors 2, 3, 4 and 5 (not shown) by the retaining shoulders 19, 20, 21, 22 and 32. The magnetic structure 23 is aligned with the magnetic flux sensor 18 and glued for protection. A printed circuit 31 is used to position the magnetic flux sensor 18 into the opening 24 of the magnetic structure 23 before the whole is glued.

The following should be noted for Hall Effect sensors used as magnetic flux sensors in this embodiment of the invention. When the excitation current is held constant, the output voltage is proportional to the magnetic field produced by the current being sensed or measured. Hall effect sensors generally include a constant current source, a gapped toroid core and a hall effect generator extending into the gap of the core. Positioning of the hall effect generator within the gap is important because inaccurate and unsteady positioning of the hall effect generator within the gap may result in the hall effect sensor malfunctioning.

Additionally, environmental factors may also impact the proper functioning of the hall effect sensor. More particularly, outside contaminants (e. g., dust, dirt, grime, oil, fluids) may hinder the operation of the hall effect sensor.

In view of the above, there is a need for a packaging arrangement that provides for secure and stable positioning of the hall effect generator inside the air gap of the hall effect sensor, which the present arrangement solves. It also insulates the hall effect sensor from an impeding effect on the sensor resulting from contaminants.

In the case where no retaining shoulders are used, since the Hall effect sensor is introduced in the air gap and that the air gap is slightly larger than the size of the Hall effect sensor, there will be a small loss of linearity of the value measured. Therefore, during calibration of the sensor, each Hall Effect sensor will be linearized by adjusting the calibration within the software used to collect the data and potentially interpret it.

Although this embodiment is described with the use of Hall Effect sensors, it should be noted that any magnetic flux sensor, not necessarily a hall effect sensor, can be used. For example, the magnetic flux sensor could be a magnetoresistivity sensor. The arrangement of the components would be the same even though an extra connection would be needed and the current draw of the magnetoresistivy sensor is higher than that of the Hall effect sensor.

A processor 29, a Digital Signal Processor for instance, is located at a middle position between the electrical conductors inputs 2, 3, 4 and 5 in order to limit the voltage drop and the disturbances between the magnetic flux sensors 14, 15, 16, 17 and 18 and the processor 29. The magnetic flux around the electrical conductors 2, 3, 4 and 5 are converted into proportional analog signals by the magnetic flux sensors 14, 15, 16 and 17 and the differential magnetic flux, corresponding to the differential current in electrical conductors in inputs 2, 3, 4 and 5, is converted into a proportional analog signal by the magnetic flux sensor 18. These signals are transmitted to the DSP 29 which processes and converts the analog signals into digital signals.

Although it is possible to have an analog output of the signals captured, a digital output is preferred because analog outputs tend to be affected by the neighbouring magnetic flux, which could cause reliability and precision errors in the transmitted data.

The detection of voltage in the conductors will be done by a copper trace 25, 26, 27 and 28 located directly on the printed circuit 31. The copper trace is shaped like a half moon around the electrical conductor inputs 2, 3, 4 and 5. This copper trace 25, 26, 27 and 28 will act as an antenna. The voltage sensed by the copper traces will be transmitted directly to the signal processor 29 by the printed circuit 31. The processor 29 will be able to confirm the absence of voltage on each line individually 2, 3, 4 and 5.

Any shape or material which could sense a magnetic flux and therefore detect the presence of a voltage in the conductors can be used. Preferable, the choice of shape and material creates an antenna, as with the copper half-moon trace.

The connector 30 serves for both the power of the electronic circuits and the data transmission.

It will be understood that the invention is not limited to the specific forms shown and/or described. For example, the core may have a variety of configurations and sizes including rounded or bevelled lead-in surfaces and interlocking dimples to help hold the laminations together, at least during manufacture; the hall generator preferably is centered with respect to the core faces and oriented generally perpendicular with respect to the conductor, but those parameters may be altered; the materials utilized in forming the conductor, the core and the circuit boards may be varied depending on the specific application; a wide variety of primary printed circuit boards may be utilized depending on the specific application and environment in which the sensor system is utilized; and the sensor systems may be combined with a variety of other features within a given component.

In a simple expression, the current sensor therefore comprises a ring-shaped magnetic structure for receiving an electrical conductor whereby the magnetic structure can be positioned along the electrical conductor, a magnetic flux sensor for evaluating a magnetic flux generated by a current flowing in the electrical conductor; an opening within the ring-shaped magnetic structure for receiving the magnetic flux sensor; and a data acquisition module for receiving a reading from the magnetic flux sensor concerning the current. In this simple embodiment, the sensor is used to measure current of only one conductor.

In another simple embodiment, the current sensor comprises a plurality of ring-shaped magnetic structures, magnetic flux sensors and openings and each of the plurality is used for one of a plurality of electrical conductors. This is the case where a sensor for four conductors is built, as is shown in FIG. 1.

When the sensor is to be used with more than one conductor, it preferably includes a global ring-shaped magnetic structure surrounding all of the plurality of ring-shaped magnetic structure; and a global magnetic flux sensor for evaluating a magnetic flux generated by currents flowing in all said electrical conductors. A differential reading of current flowing in each conductor can then be measured.

The plan view shown in FIG. 2A shows the dimensions and arrangement of the components in accordance with an embodiment of the invention.

In a particular embodiment, the current sensor is intended to receive four electrical conductors (three phase circuit with neutral, 3Ø-4W). The diameter (D) of the electrical conductor input holes 2, 3, 4 and 5 is determined according to the electrical conductor diameter to be inserted in the sensor body. The magnetic structures 6, 7, 8 and 9 used in the present model is made by Panasonic, the model number is KR16TT18106 and the dimensions are 18 mm OD, 10 mm ID, 6 mm HT. The width of the retaining shoulder 19, 20, 21 and 22 is illustrated by the "F" dimension of FIG. 2A. The top part (cover) 1A of the sensor holds the magnetic structures 6, 7, 8 and 9 in place with an internal and external shoulder.

The magnetic flux sensors 14, 15, 16 and 17 are inserted in openings 10, 11, 12 and 13 and are kept in place with the use of glue. The magnetic flux sensors 14, 15, 16 and 17 used in the present model are made by Allegro Microsystems inc. They are part of the A132X model family and the dimensions are 4.04 mm OD, 1.47 mm ID, 3.10 mm HT. The dimension of the openings 12, 11, 12, 13 and 24 in the magnetic structures is indicated by the "E" dimension of FIG. 2A.

The plan view shown in FIG. 2B shows the dimensions and arrangement of the components for a differential reading of leakage currents in accordance with an embodiment of the invention. In an embodiment, the sensor 100 is intended to receive the four electrical conductors (not shown) for an analysis in differential mode. The magnetic structure 23 used in the present model is made by Magnetics, the model number is 54-454-1-E and the dimensions are 44.45 mm OD, 31.8 mm ID, 3.18 mm HT. The width of the retaining shoulder 32 is illustrated by the "G" dimension of FIG. 2A.

The magnetic flux sensor 18 is inserted in opening 24 and is kept in place with the use of glue. The magnetic flux sensor 18 used in the present model is made by Allegro Microsystems inc. It is part of the A132X model family and the dimensions are 4.04 mm OD, 1.47 mm ID, 3.10 mm HT. The dimension of the opening in the magnetic structure is indicated by the "E" dimension of FIG. 2A.

It should be understood that the above given dimensions are meant to be exemplary only and that any other dimensions adapted to the electrical conductors on which the current sensor is to be installed could also be used.

The Hall Effect sensors along with the magnetic structures permit to measure the signal frequency, the amplitude and the harmonic content in relation with the line and the neutral conductors.

FIG. 3 shows an electric motor current inrush at start-up. Section A of FIG. 3 shows the amplitude of the current and the duration of the inrush while part B shows the value of the current during steady-state operation.

In section C of FIG. 4 we can see a sudden current inrush usually generated by a mechanical problem.

Figure 5:
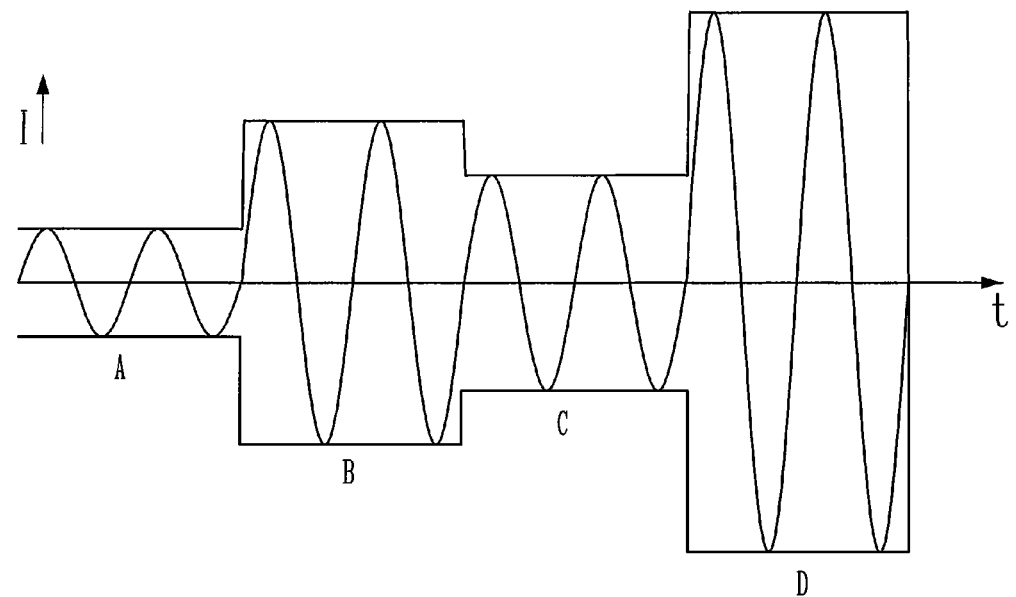
FIG. 5 is a graph illustrating load variations of a circuit.

The total load of a distribution can be monitored by installing a sensor on the main conductors of the entrance. FIG. 5 gives an example of the evolution of the load on a distribution. Section A shows a steady state value of current on the distribution. Section B would be created by the start-up of a motor for example, followed by section C showing the steady state current including the motor. Section D shows that an additional load has been turned ON.

The current sensor offers two possibilities for the measurement of leakage current. The first method consists in computing the leakage current from the values measured by the Hall Effect sensor of each conductor. The second option is to obtain the value of the leakage current from the outer Hall Effect sensor including all the conductors. The first method will be preferred in the case of small line currents.

The leakage current spectrum is mostly similar to the line current spectrum.

Figure 6:
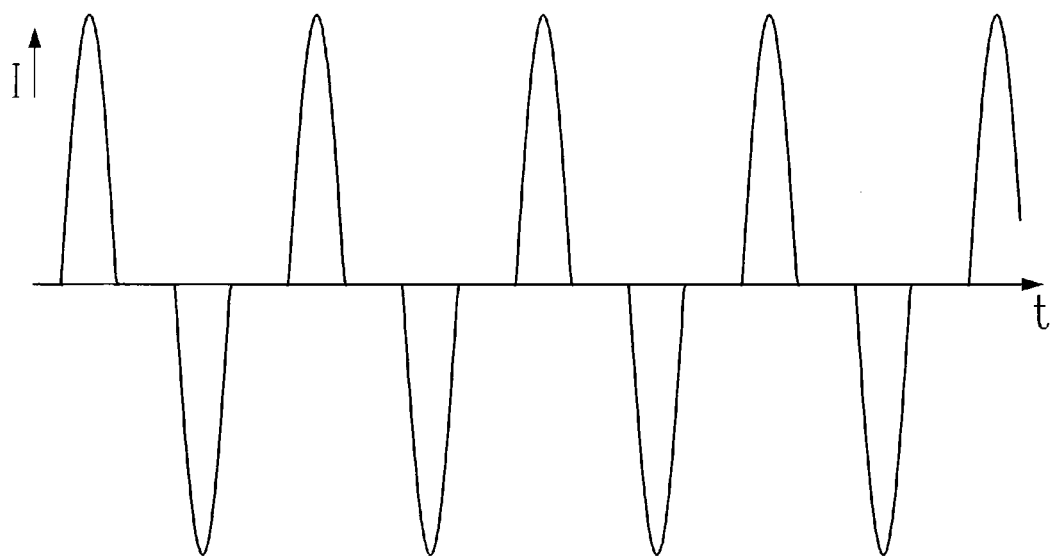
FIG. 6 is a graph illustrating the current of a non-linear load.

FIG. 6 shows the shape of the current generated by a variable speed motor drive using the thyristor technology (120 Hz switching).

FIGS. 7A and 7B show the difference between the shapes of the currents generated by single phase (7A) and three phase (7B) PWM motor drives (PWM=IGBT transistors, 10 KHz-20 KHz).

Figure 8:
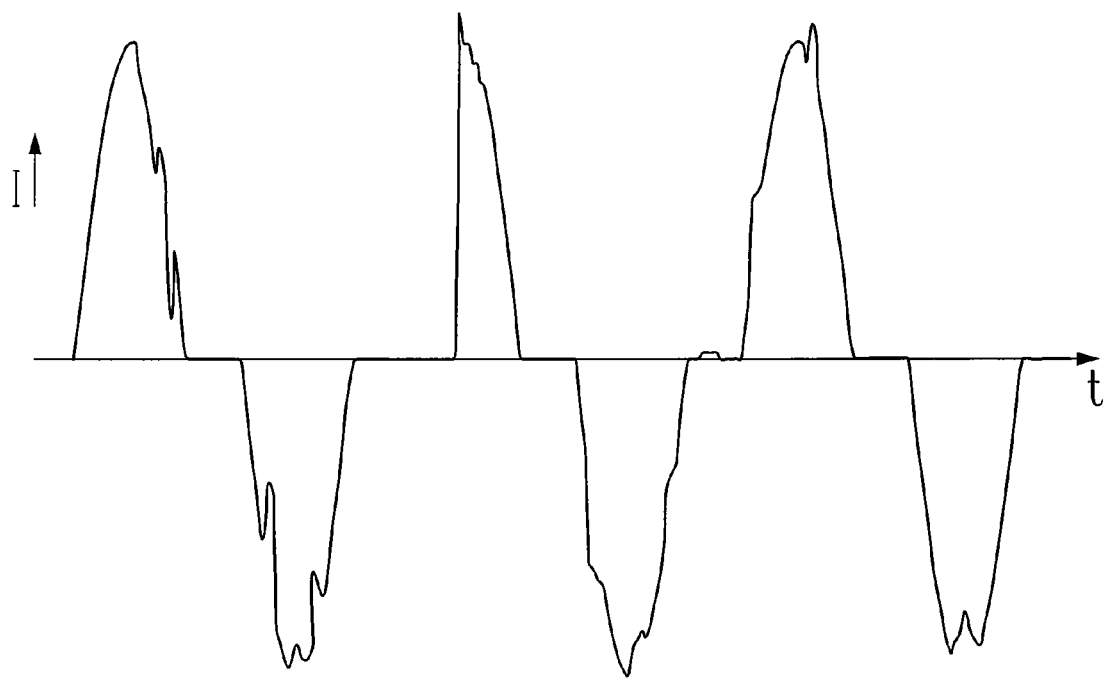
FIG. 8 is a graph illustrating the harmonics generated by an electrical arc.

FIG. 8 shows the shape of the load current of an electrical equipment which has a fault on a conductor (bad joint). The signal is composed of low and medium frequencies with random shapes.

The current sensor can be used in many ways. Its location is chosen according to the monitoring needs.

Figure 9A:
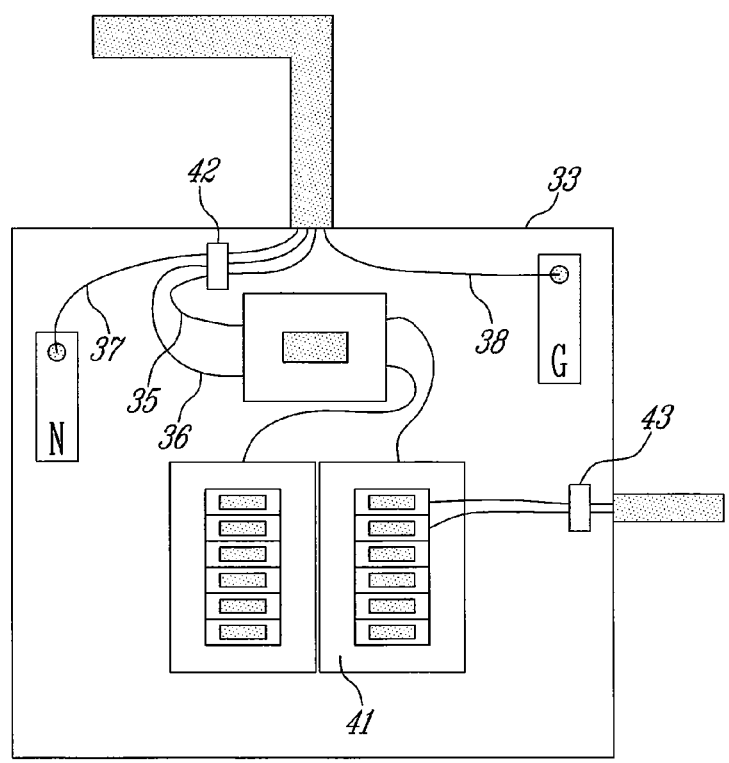
FIG. 9A is a block diagram showing current sensors locations in an electrical distribution panel according to an embodiment of the invention.

FIG. 9A shows an electrical panel 33 of a building. The panel 33 is fed by four conductors 35, 36, 37 and 38 installed inside a conduit; the line conductors 35 and 36, the neutral conductor 37 and the grounding conductor 38. The line conductors 35 and 36 and the neutral conductor 37 are inserted in the current sensor 42. From this location, it is possible to analyze the current spectrum, detect the presence of harmonics and identify their sources (what type of non-linear loads), detect the presence of electrical arcs and measure the value of the leakage current (resistive or capacitive). The preceding information concerns the whole building distribution since the sensor is installed on the main conductors. When current sensors are installed on the circuits of the distribution panel 33, the same information is available for each circuit 41 monitored by a sensor.

Figure 9B:
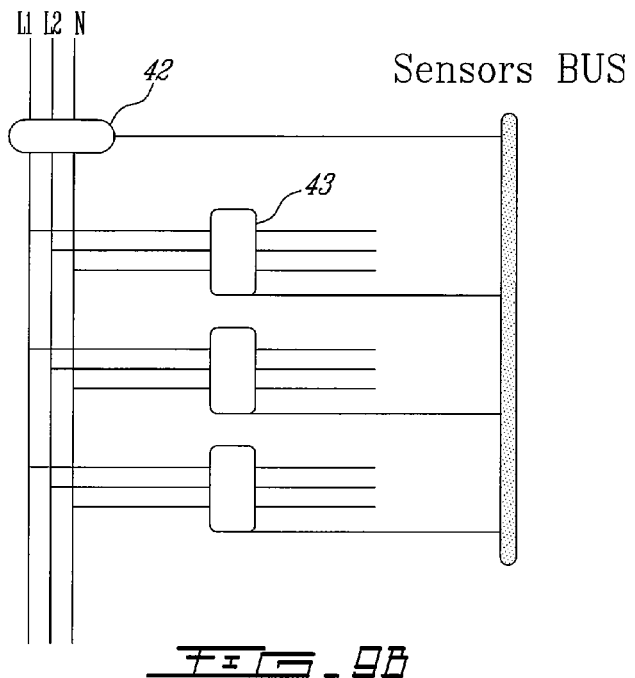
FIG. 9B is a block diagram showing a current sensor arrangement for the complete monitoring of a distribution panel according to an embodiment of the invention.

FIG. 9B shows the sensor 42 and 43 arrangement for the complete monitoring of a distribution panel 33, one sensor 42 on the main conductors and one sensor 43 on each circuit leaving the panel.

Figure 10:
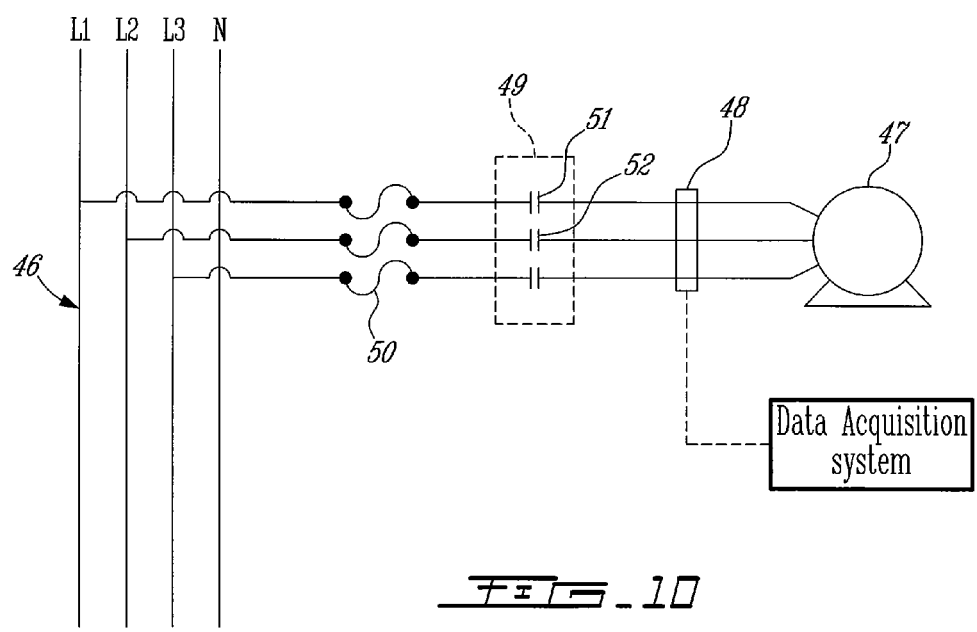
FIG. 10 is a block diagram showing localisations of current sensors on electrical networks according to an embodiment of the invention.

FIG. 10 shows a circuit of an electrical distribution 46 feeding a motor 47. The current sensor 48 is placed between the motor starter 49 and the motor 47. From this location, the sensor can provide information concerning the condition of the fuse or the overload 50, the condition of the contacts 51 of the contactor 49, the presence of electric arcs generated by a worn contact 52 of the contactor and also the value of the leakage current. Moreover, this new generation of current sensor can be part of an integrated management system, an energy monitoring system or a fire alarm system for example.

Figure 11:
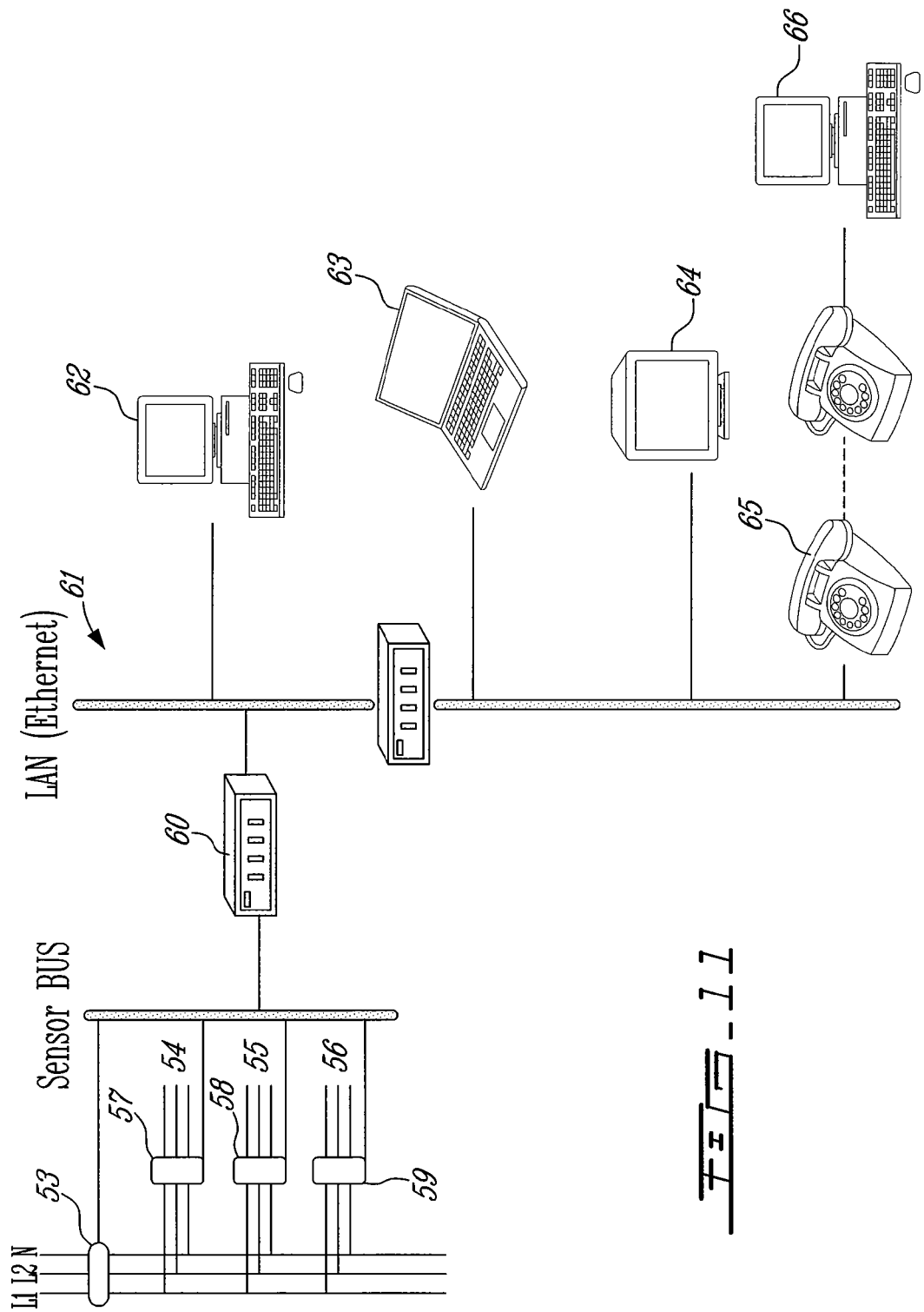
FIG. 11 is a block diagram showing a typical network architecture according to an embodiment of the invention.

As shown in FIG. 11, the current sensor 53 can be located on the main distribution. Moreover, each circuit 54, 55 and 56 may carry a current sensor 57, 58 and 59. All the sensors 53, 57, 58 and 59 are connected to a hub 60.

The hub 60 is connected to an Ethernet network 61. The data transmitted by the current sensors 53, 57, 58 and 59 can be analysed by a computer system 62, a laptop computer 63, or a dedicated monitor 64. For an external link, the current sensor 53, 57, 58 and 59 can be linked to a computer system 66 by modem 65.

The present current sensor can be used in any environment where detection of currents, especially stray currents, is needed.

The potential applications for the agricultural domain, without being limited to, may apply to the following electrical equipment: the main electrical distribution, the distribution panels, the distribution circuits or the motors.

For a personalized management of the electrical network, the sensor can be installed at the Voluntary Milking System (milking robot), at the pulsator heads controller, at the water pump controller, at power supplies, in portable milkers, in the feed control panel or in the stable cleaner controller, for instance.

The current sensor, for whatever purpose it may serve, may be used in the commercial and industrial sectors. The electrical networks configurations of dairy facilities of more than 100 cows are similar in every aspect to the ones found in these sectors.

In the residential sector, in addition to its application for the loads in general, this current sensor has a competitive advantage on the arc-detecting circuit breaker and could be used advantageously.

Nowadays, electrical equipment safety is an important financial and social issue all around the world. Heteroclite development in numerous countries, free access to electrician profession and lack of control systems played a role in the emergence of hazardous equipments.

As previously mentioned, according to an embodiment, a current sensor includes a programmable circuit, as a processor, providing computing faculties for considering some relevant derivatives and magnitudes. Associating thresholds to each type of perturbations provides management and prioritisation of the possible reaction commands including load shedding.

Figure 12:
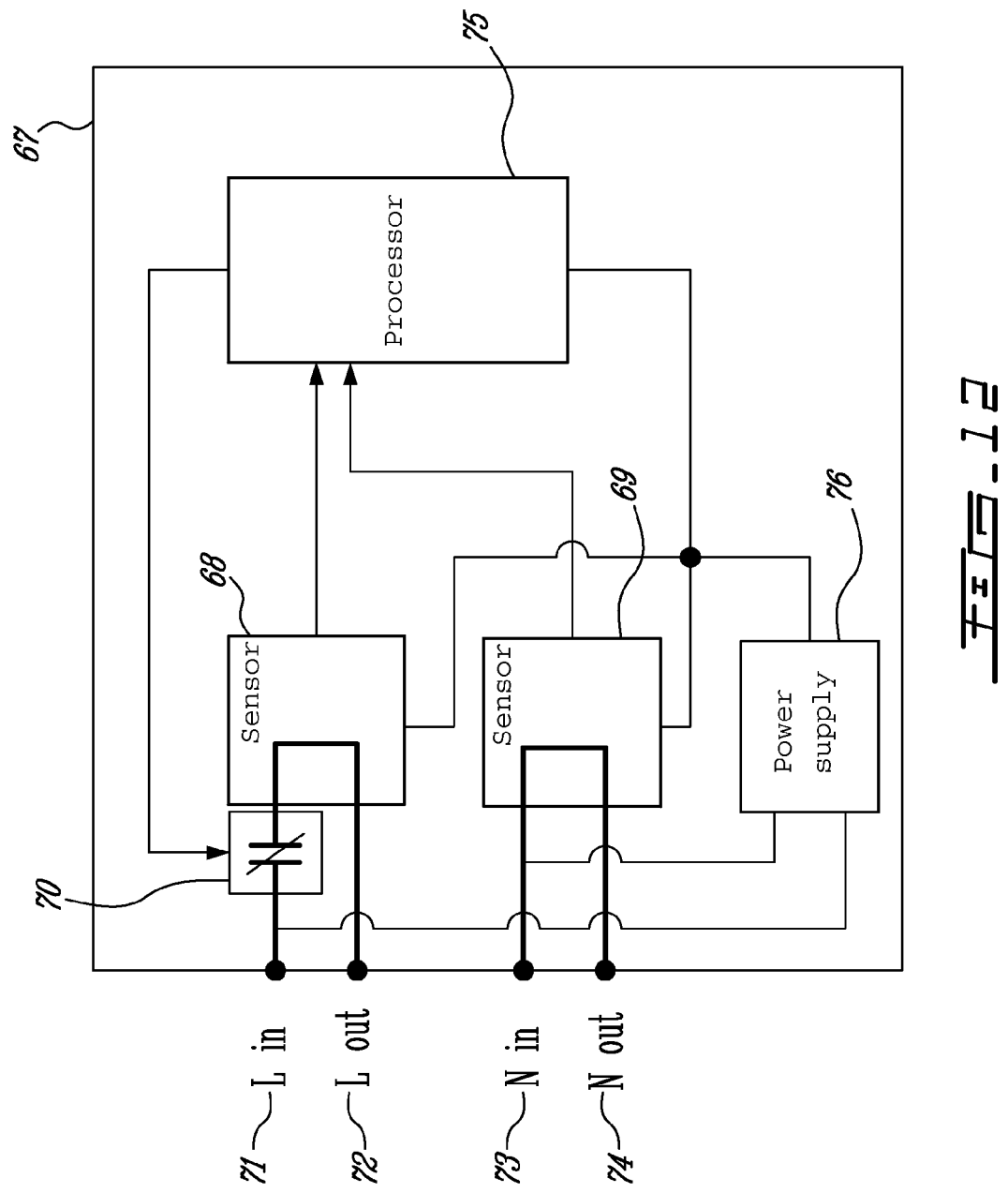
FIG. 12 is a block diagram showing the electrical connections in an intrusive current sensor according to an embodiment of the invention.

FIG. 12 is a block diagram showing the main components and the electrical connections in an intrusive current sensor, according to an embodiment of the invention. In this embodiment, the intrusive current sensor is mounted on a printed circuit 67. The electric circuit conductors (not shown) are connected to inputs/outputs 71, 72, 73, 74. The current sensor individually receives a line conductor connected to the input/output 71, 72 and a ground conductor connected to the input/output 73, 74 such that current in each conductor can be analysed individually. The intrusive current sensor could alternatively be adapted to receive only one conductor or more than two conductors such as three line conductors and one neutral conductor for three-phase applications, for example.

The processor 75 is positioned on the printed circuit 67 proximate the magnetic flux sensors 68, 69 in order to minimize voltage drop and interferences. The magnetic flux sensors 68, 69 converts the magnetic flux created by the current flow in the conductors into an analog signal. The analog signal is then directed to the processor 75 for analysis. The processor 75 detects electrical disturbances on the current and provides an electrical disturbance signal to control an on/off switch 70, a TRIAC or a contactor for instance, for disconnecting the load in reaction to a command from the processor 75. A power supply 76 is also included to power the sensor.

In this embodiment, the magnetic flux sensors 68, 69 are intrusive Hall effect sensors of model ACS704ELC-015 from Allegro but it is contemplated that non-intrusive Hall effect sensors and that other types of magnetic flux sensors, as magnetoresistive sensors, may alternatively be used.

The magnetic flux sensor and the circuit boards may be varied depending on the specific application; a wide variety of primary printed circuit boards may be utilized depending on the specific application and environment in which the sensor system is utilized; and the sensor systems may be combined with a variety of other features within a given component.

It should be appreciated that the intrusive current sensor may comprise voltage detectors (not shown) connected in parallel with magnetic flux sensors 68, 69 or connected between the inputs 71, 73 to measure a differential voltage.

FIG. 13 illustrates a possible use of an intrusive current sensor. A table fan 80 is plugged in a house power outlet 77. A current sensor 78 is located at the fan electrical connection 79, preferably inside the fan 80. The current sensor 78 checks for abnormal operation of the fan 80 by detecting an occurrence of an electrical disturbance such as an electric arc, overload and underload. The fan 80 can be disconnected using the on/off switch 70 under specific conditions.

This new type of current sensor is adapted to analyse a serial, a parallel or a differential default and eventually initiate a reaction command on the electrical circuit.

The embodiments of the invention described above are intended to be exemplary only. The scope of the invention is therefore intended to be limited solely by the scope of the appended claims.

What is claimed is:

1. A current sensor for measuring an electrical current on an electrical circuit having an electrical conductor, said current sensor comprising:
   a ring-shaped magnetic structure for receiving said electrical conductor, wherein an interior diameter of said ring-shaped magnetic structure is substantially equal to a diameter of said electrical conductor;
   a magnetic flux sensor for sensing a magnetic flux generated in said magnetic structure by a current flowing in said electrical conductor and for providing a signal representative of said current;
   said ring-shaped magnetic structure comprising an opening for receiving said magnetic flux sensor;
   an analog to digital converter for acquiring said signal from said magnetic flux sensor and converting said signal into a digital sensor data;
   a processor for receiving said digital sensor data, detecting an electrical disturbance on said current and providing electrical disturbance data;
   a printed circuit board having said magnetic flux sensor, said analog to digital converter and said processor supported on a surface thereof with electrical connections soldered thereto such that said printed circuit board electrically interconnects said magnetic flux sensor, said analog to digital converter and said processor; and
   a casing encapsulating therein said ring-shaped magnetic structure and said printed circuit board with said magnetic flux sensor said analog to digital converter and said processor, said casing having an input hole throughout for passing said electrical conductor therethrough and through said ring-shaped magnetic structure such that said current sensor is positionable an here along said electrical conductor.

2. The current sensor as claimed in claim 1, wherein said magnetic flux sensor is further for measuring a shape and an amplitude of said current, said shape comprising a wide range of frequencies.

3. The current sensor as claimed in claim 1, wherein said processor is further for detecting a leakage current from said signal.

4. The current sensor as claimed in claim 1, wherein said magnetic flux sensor comprises a hall effect sensor.

5. The current sensor as claimed in claim 1, further comprising retaining means for retaining said magnetic structure and said magnetic flux sensor around said electrical conductor.

6. The current sensor as claimed in claim 1, further comprising a voltage detector for detecting a voltage on said electrical conductor.

7. The current sensor as claimed in claim 6, wherein said voltage detector is shaped in a half moon surrounding said electrical conductor and comprises a conductive trace on a substrate for generating a voltage signal if voltage is present in said conductor, and wherein said voltage signal is received by said processor.

8. The current sensor as claimed in claim 1, further comprising an emitter for transmitting said electrical disturbance data.

9. The current sensor as claimed in claim 1, further comprising a plurality of each of said ring-shaped magnetic structure, magnetic flux sensor and opening and wherein each of said plurality is for one of a plurality of electrical conductors.

10. The current sensor as claimed in claim 9, further comprising:
a global ring-shaped magnetic structure surrounding all of said plurality of ring-shaped magnetic structures; and
a global magnetic flux sensor for evaluating a magnetic flux generated by currents flowing in all said electrical conductors;
wherein a differential reading of current flowing in each conductor of said plurality of electrical conductors can be measured.

11. The current sensor as claimed in claim 9, wherein said electrical conductors comprise three line conductors and one neutral conductor.

12. The current sensor as claimed in claim 1, wherein said analog to digital converter is included in said processor.

13. A current sensor for measuring an electrical current in an electrical circuit having an electrical conductor, said current sensor comprising:
a magnetic structure for receiving said electrical conductor;
a magnetic flux sensor in series with said electrical conductor for sensing a magnetic flux generated in said magnetic structure by a current flowing in said electrical conductor and providing a signal representative of a value of said current at a specific time over a period of time;
an analog to digital converter for acquiring said signal of said value of said current over said period of time from said magnetic flux sensor and converting said signal into digital sensor data;
a processor for receiving said digital sensor data, detecting an electrical disturbance on said electrical conductor using said value of said current over said period of time and for providing an electrical disturbance signal;
a printed circuit board having said magnetic flux sensor, said analog to digital converter and said processor supported on a surface thereof with electrical connections soldered thereto such that said printed circuit board electrically interconnects said magnetic flux sensor, said analog to digital converter and said processor; and
a casing encapsulating therein said magnetic structure and said printed circuit board with said magnetic flux sensor, said analog to digital converter and said processor into a single device positionable anywhere along said electrical conductor.

14. The current sensor as claimed in claim 13, further comprising an electrical switch for disconnecting said electrical conductor in response to said electrical disturbance signal and thereby protecting said electrical circuit from being damaged.

15. The current sensor as claimed in claim 13, wherein said processor is further for computing a leakage current from said signal.

16. The current sensor as claimed in claim 13, wherein said magnetic flux sensor is further for measuring a shape and an amplitude of said current, said shape comprising a wide range of frequencies.

17. The current sensor as claimed in claim 13, wherein said magnetic flux sensor comprises a hall effect sensor.

18. The current sensor as claimed in claim 13, further comprising a voltage detector for detecting a voltage on said electrical conductor.

19. The current sensor as claimed in claim 13, further comprising an emitter for transmitting said digital sensor data.

20. The current sensor as claimed in claim 13, further comprising a plurality of said magnetic flux sensor, each of said plurality being for one of a plurality of electrical conductors.

21. The current sensor as claimed in claim 20, wherein said electrical conductors are a line conductors and a neutral conductor.

22. The current sensor as claimed in claim 13, wherein said analog to digital converter is included in said processor.

23. An electrical current monitoring system, comprising:
a plurality of current sensors each associated with an electrical conductor and an identifier, each having:
a magnetic structure for receiving said electrical conductor whereby the magnetic structure can be positioned along said electrical conductor;
a magnetic flux sensor in series with said electrical conductor for sensing a magnetic flux generated in said magnetic structure by a current flowing in said electrical conductor and providing a signal representative of a value of said current at a specific time over a period of time;
an analog to digital converter for acquiring said signal of said value of said current over said period of time from said magnetic flux sensor and converting said signal into digital sensor data;
a processor for receiving said digital sensor data, detecting an electrical disturbance on said electrical conductor using said value of said current over said period of time and for providing an electrical disturbance signal;
a printed circuit board having said magnetic flux sensor, said analog to digital converter and said processor supported on a surface thereof and having electrical connections soldered thereto such that said printed circuit board electrically interconnects said magnetic flux sensor, said analog to digital converter and said processor; and
a casing encapsulating therein said magnetic structure and said printed circuit board with said magnetic flux sensor said analog to digital converter and said processor such that said current sensor is to be positioned along said electrical conductor;

a networking module for combining data provided by said plurality of current sensors; and a processing module for receiving and for analyzing the combined data, for monitoring and for locating, using said identifier, said electrical disturbance and for alerting in case of abnormal situations.

24. The electrical current monitoring system as claimed in claim 23, further comprising a user interface for extracting and for displaying electrical disturbance data and for initiating a command in reaction to said electrical disturbance.

25. The electrical current monitoring system as claimed in claim 23, wherein each one of said current sensor is associated with a plurality of electrical conductors.

26. The electrical current monitoring system as claimed in claim 23, wherein said processor is further for computing a leakage current from said signal.

27. The electrical current monitoring system as claimed in claim 23, wherein said magnetic flux sensor is further for measuring a shape and an amplitude of said current, said shape comprising a wide range of frequencies.

28. The electrical current monitoring system as claimed in claim 23, wherein said analog to digital converter is included in said processor.

* * * * *

UNITED STATES PATENT AND TRADEMARK OFFICE
CERTIFICATE OF CORRECTION

PATENT NO. : 7,714,588 B2  Page 1 of 1
APPLICATION NO. : 12/254056
DATED : May 11, 2010
INVENTOR(S) : Michel Montreuil It is certified that error appears in the above-identified patent and that said Letters Patent is hereby corrected as shown below:

Column 10, line 61, claim 1, "said magnetic flux sensor said analog to digital converter" should be changed to
--said magnetic flux sensor, said analog to digital converter--;

line 66, claim 1, "an here" should be changed to --anywhere--.

Column 12, line 67, claim 23, "said magnetic flux sensor said analog to digital converter" should be changed to
--said magnetic flux sensor, said analog to digital converter--.

Signed and Sealed this

Twenty-sixth Day of October, 2010

David J. Kappos
*Director of the United States Patent and Trademark Office*